United States Patent [19]
Meuriche et al.

[11] Patent Number: 4,757,502
[45] Date of Patent: Jul. 12, 1988

[54] AUTOMATIC GAIN CONTROL METHOD AND CIRCUIT FOR A TIME DIVISION MULTIPLE ACCESS RECEIVER

[75] Inventors: Bernard Meuriche, Paris; Claude Bareyt, Montmorency, both of France

[73] Assignee: Alcatel Thomson Faisceaux Hertizens, Cedex, France

[21] Appl. No.: 820,292

[22] Filed: Jan. 21, 1986

[30] Foreign Application Priority Data

Jan. 22, 1985 [FR] France ................. 85 00859

[51] Int. Cl.⁴ ............................... H04J 3/02
[52] U.S. Cl. ........................ 370/104; 375/98
[58] Field of Search ........ 370/104, 94, 60, 95; 375/98

[56] References Cited
U.S. PATENT DOCUMENTS 4,464,723 8/1984 Charitier ................. 375/98
4,656,630 4/1987 Miyo ...................... 370/104

FOREIGN PATENT DOCUMENTS 0151916 8/1985 European Pat. Off. .

Primary Examiner—Douglas W. Olms
Attorney, Agent, or Firm—Sughrue, Mion, Zinn, Macpeak & Seas

[57] ABSTRACT

An AGC method and circuit for a receiver of time division multiple access signals, e.g. signals transmitted by a satellite or be microwave links. The AGC circuit includes a highspeed attenuator (24) constituted by two ring mixers (40, 41) connected in series and controlled in parallel, the AGC feedback loop (312) is sampled by a highspeed sampler (14) which is activated under the control of a control feedback loop (313) solely during the beginning of the preamble of each packet, during the period which enables the carrier to be recovered. The AGC voltage is then stored on a capacitor (16) and continues to be applied to control the attenuator (34) during the remainder of the time taken to receive the packet.

6 Claims, 4 Drawing Sheets

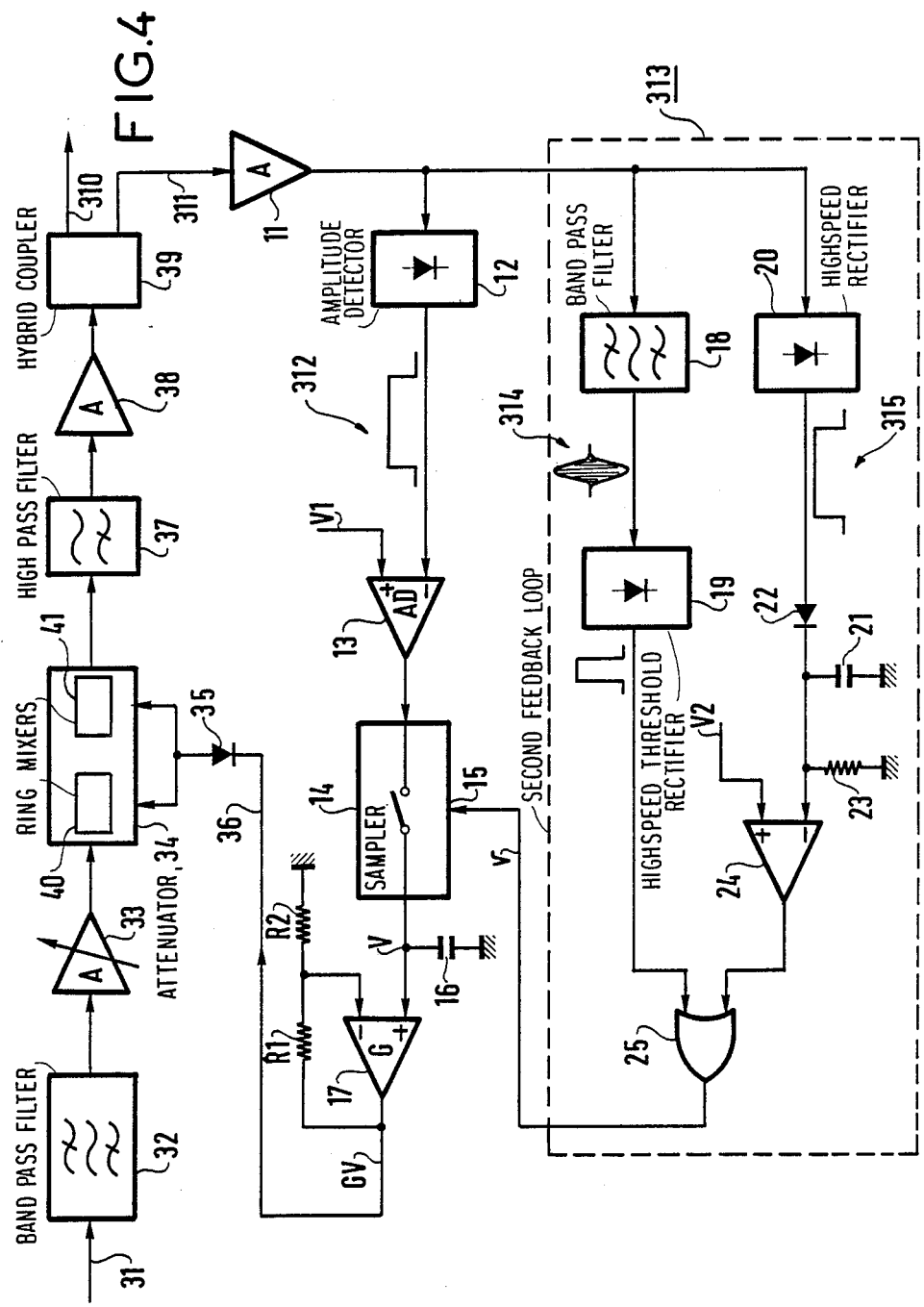

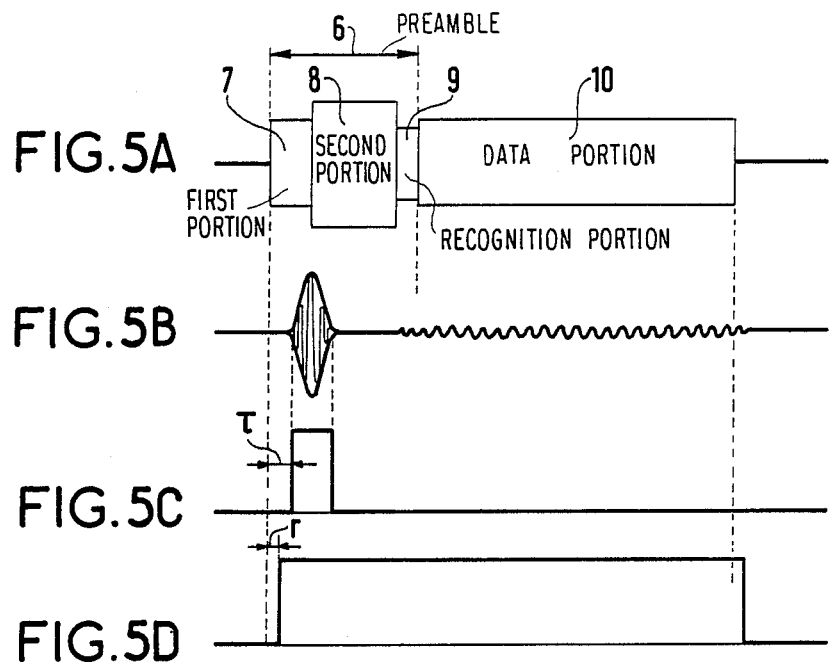
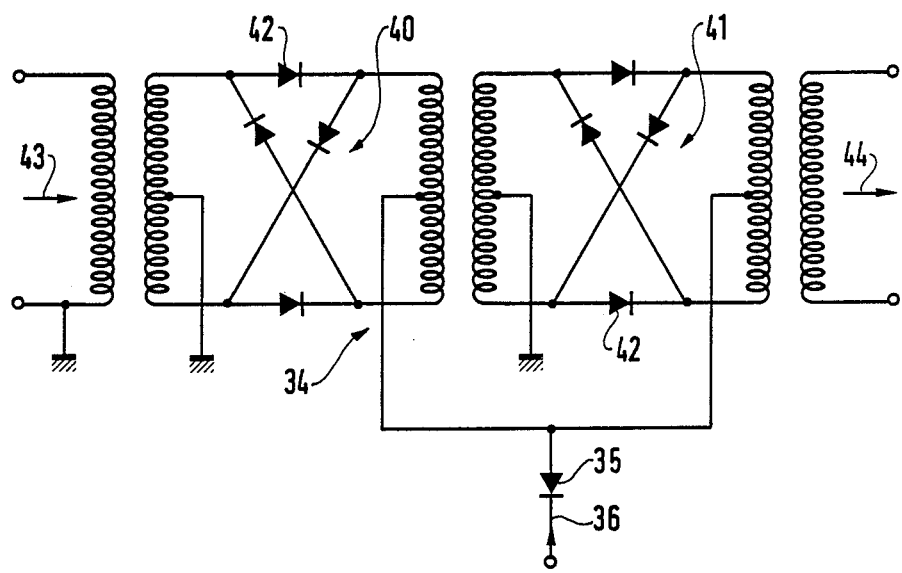

AUTOMATIC GAIN CONTROL METHOD AND CIRCUIT FOR A TIME DIVISION MULTIPLE ACCESS RECEIVER

The present invention relates to an automatic gain control (AGC) method and circuit for a receiver intended for receiving signals such as satellite transmissions or microwave beam signals, which signals are transmitted to said receiver using time division multiple access (TDMA).

BACKGROUND OF THE INVENTION

Accompanying FIG. 1 is a diagram showing the transmission of telephone calls or data via a satellite operating in TDMA mode.

As shown in the figure, a first transmitter station 1 transmits a first packet of data A to a telecommunications satellite 2, which packet is received by the satellite between instants t and $(t+t_0)$, while a second transmitter station 3 transmits a second data packet B which is received by the satellite between instants $(t+t_0+\epsilon)$ and $(t+t_0+\epsilon+t_1)$, where $\epsilon$ is a very short time interval which may tend, in the limit, to zero. The data packets A and B transit through the satellite 2 which re-transmits them one after the other towards a receiver station 4 as shown diagrammatically in the figure. The receiver 4 thus receives the packet A followed by the packet B after an intervening guard time interval equal to $\epsilon$.

The data packets A and B which thus pass through the satellite 2 come from different directions and therefore do not follow identical paths. They may therefore be subject to different fading. For example, if weather conditions are unfavorable over transmitter station 3, e.g. by virtue of a zone of rain 5, the packets A and B willl not be of the same amplitude on arrival at the satellite 2. And as a result the receiver station 4 has to demodulate signals which include a wide range of levels.

By way of specific example, the INTELSAT and EUTELSAT satellite telecommunications networks are designed to tolerate successive packets having levels which differ by as much as 5 dB, with the level of each packet lying somewhere in the range +2 dB to −10 dB relative to the nominal reception level.

It can thus happen that the receiver station 4 receives signals A or B which are either at too high a level or at too low a level, thereby increasing the error rate on reception of each signal, and thus degrading transmission. As is explained below, it is not a priori possible to provide the receiver 4 with a conventional automatic gain control (AGC) circuit as is used for conventional traffic receivers, with the result that the sole solution existing heretofore consists in correcting the level differences in an experimental manner. It is thus conventional for an operator located at receiver station 4 to make use of service channels to warn transmitter stations 1 and/or 3 of the poor reception quality of signals transmitted therefrom, and thus ask them to temporarily increase or decrease the level at which the signals are transmitted.

Naturally such an experimental procedure is unsatisfactory for quality of reception since the response time is necessarily rather long, and also since it is subject to human failings, and it would therefore be desirable to provide an AGC circuit for the receiver 4.

Unfortunately, as mentioned above, a conventional AGC cannot be used in such a receiver. Conventional AGC circuits have a relatively long response time and act on signals whose power corresponds to an average of the received signal powers. Under such conditions, any signal packets A or B which correspond to a lower power than average, either because of their low amplitude or because of their short duration, or for both reasons, would have little or no effect on the AGC which would operate as a function of the more powerful packets A or B, such that packet demodulation would continue, overall, to occur under poor conditions.

Naturally the use of a fast AGC is not, a priori, possible either since such fast correction, even if it could be provided, would tend to level out the amplitude of the signals themselves, thereby degrading transmission. Further, so far as the Applicant is aware, such high-speed AGCs are not available at present, and in particular for the reason mentioned.

Also, in TDMA each transmitted and received data packet (A or B in FIG. 1) comprises in succession: an acquisition sequence or preamble, followed by data which constitutes the useful signal and is generally in digital form. For example, in the INTELSAT and EUTELSAT systems, a data packet A or B comprises, in succession and as outlined in accompanying FIG. 2, a three-portion preamble 6 and a data portion 10. The preamble 6 comprises:

a first portion 7 constituted by an unmodulated wave whose frequency is equal to the carrier wave frequency, e.g. 140 MHz in the intermediate frequency band, said first portion being of fairly short duration, e.g. about 1 microsecond, and being intended to allow the carrier frequency to be recovered in the receiver's demodulator;

a second portion 8 of carrier wave including phase shifts to enable the clock frequency to be recovered by the demodulator, with the carrier wave being practically fully modulated by a sinusoidal wave of twice the clock period, in a manner which is explained in greater detail below; and a last portion 9, constituted by a recognition word or "unique word" which is digitally encoded and which serves, for example, to remove ambiguity on the phase state of the carrier which corresponds to level 00 (when using four-state phase modulation, for example), or in other words serving to provide an absolute phase reference on reception.

The data portion 10 is generally longer than the entire preamble 6 and may have a duration of 3 us for example, said portion comprising the entire data content of the packet and being constituted by a succession transmission symbols.

Preferred implementations of the present invention provide a method and a circuit enabling automatic gain control to be provided for a time division multiple access receiver.

SUMMARY OF THE INVENTION

The present invention provides a method of providing automatic gain control (AGC) in a time division multiple access (TDMA) receiver, said receiver receiving data packets in succession from one or more transmitter stations, each packet comprising, in succession, a preamble and then a data sequence, said preamble beginning at least with a first portion for enabling the receiver to recover the frequency of the signal carrier wave, said method consisting in performing automatic gain control on at least a part of said first portion of said preamble, in memorizing the amplitude of the AGC voltage during the period that said automatic gain control is being performed, and then in interrupting said automatic gain control while allowiong said stored AGC voltage to act on the received signal, at least for the remainder of said packet, said automatic gain control having a reaction time which is very much less than the time available for the automatic gain control to act on said part of said first portion of said preamble.

BRIEF DESCRIPTION OF THE DRAWINGS

Embodiments of the invention as applied to satellite telecommunications networks of the INTELSAT or EUTELSAT type are described by way of example with reference to the accompanying drawings, in which:

FIG. 4 is an overall block diagram of an AGC circuit in accordance with the invention;

FIGS. 5A to 5D are waveform diagrams of four different signals which occur in the FIG. 4 circuit during packet reception;

FIG. 6 is a circuit diagram of a variable attenuator used in the FIG. 4 circuit;

MORE DETAILED DESCRIPTION

Figure 1:
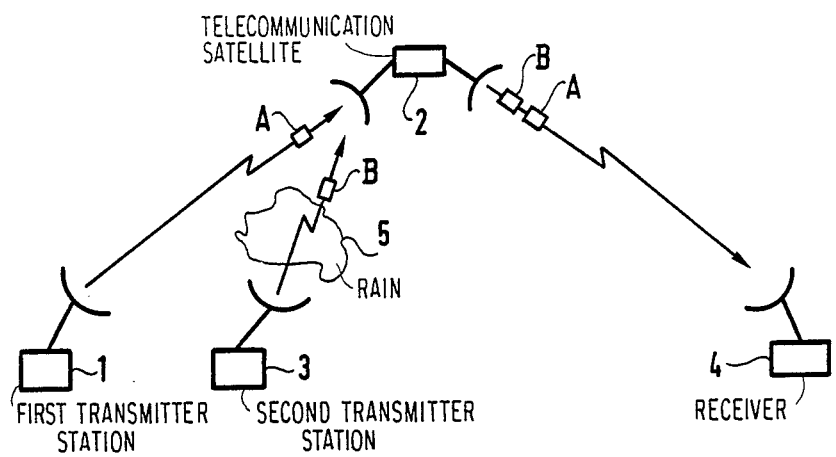
FIG. 1 is described above and is a diagram of a TDMA setup.
Figure 2:
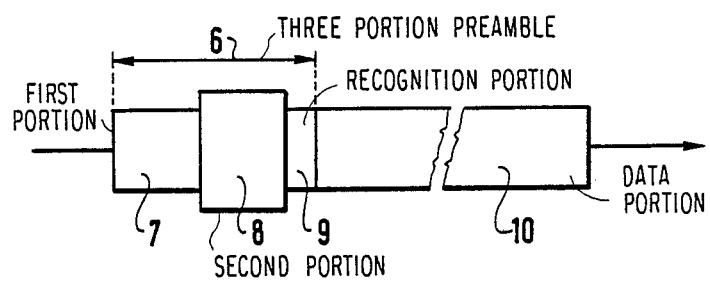
FIG. 2 is described above and is a diagram representing a data packet in the INTELSAT or the EUTELSAT network, with amplitude being plotted in the Y direction and time being plotted in the X direction.
Figure 3:
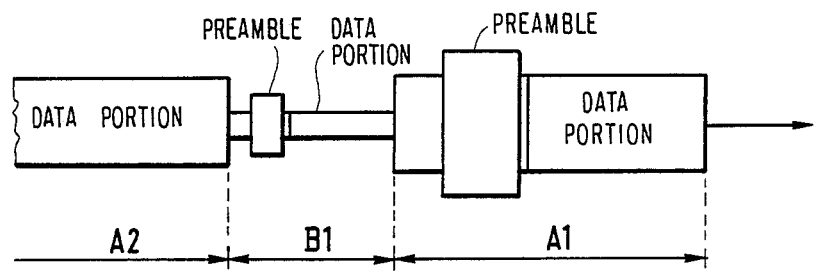
FIG. 3 is a similar diagram to FIG. 2 showing data packets received in succession by a receiver in accordance with the invention.

Reference is made initially to FIGS. 1 to 3 in which data packets A and B from transmitters 1 and 3 respectively are received successively at microwave frequencies by the receiver 4 after transiting via the satellite 2. Each packet A or B is built up, as explained above, from a preamble 6 followed by a data sequence 10. The preamble 6 has a total duration of about 3 $\mu$s at intermediate frequency (IF) for example, and comprises a first portion 7 having a duration of 1 $\mu$s for example, of unmodulated carrier frequency wave (e.g. at 140 MHz at intermediate frequency), a second portion 8 including $\pi$ phase shifts, having a duration of 2 $\mu$s, for example, and a third or recognition portion constituted by said "unique word" which is binary coded and has a duration of 0.5 $\mu$s, for example. The data sequence 10 which contains the information to be transmitted has a longer duration than the preamble 6, and may last for 100 $\mu$s at IF, for example.

As shown diagrammatically in FIG. 3, successive packets arrive one after the other, $A_1$, $B_1$, $A_2$, etc. . . , at the receiver 4 with the inter-packet gap being taken to be zero in the present case. Packets from transmitter B, e.g. the packet $B_1$ are at low amplitude because of attenuation as they pass through a zone of rain 5, for example, such that the receiver 4 reproduces them with a high error rate and communication from the station 3 is degraded.

In accordance with the invention, this drawback is mitigated by equipping the IF stage of the receiver 4 with a highspeed AGC, said AGC having a response or reaction period which is a few hundreds of nanoseconds, for example, and is used as such solely during the first portion 7 of the preamble 6 during which an unmodulated carrier frequency wave is transmitted. During this period the control voltage of the AGC is stored on a capacitance. Substantially from the end of the first portion 7 of the preamble 6 the highspeed AGC is switched off, but it continues to act via the quasi-constant control voltage stored on said capacitance. The amplitude of a low level packet such as $B_1$ can thus be increased without deforming either the data 10 or the recognition word 9.

FIG. 4 is a block diagram of an AGC circuit in accordance with the invention and fitted to the IF stage of the receiver 4 shown in FIG. 1.

In FIG. 4, reference 31 designates an intermediate frequency (140 MHz for example) input line on which non-adjusted packets are received such as the packets $A_1$, $B_1$, $A_2$, . . . as shown in FIG. 3, after transposition in a first portion of the receiver 4 from the received microwave transmission frequency (e.g. 4 GHz) to the said IF. Reference 32 designates a bandpass filter including group propagation delay correction as is conventional in this type of receiver and intended to avoid operating on frequencies lying outside the useful frequency bandwidth: in the present case the bandpass filter 32 is centered on 140 MHz and its 3 dB points are at $\pm$40 MHz from the center frequency. In conventional manner, the signal output from the bandpass filter 32 is applied to a variable gain amplifier 33 which is used to adjust the gain and flatness of the response curve of the filter 32.

In accordance with the invention, the output from the amplifier 33 is connected to a voltage-controlled IF attenuator 34 having a rapid response time relative to the duration of the preamble, e.g. having a response time of about 1 nanosecond. The attenuator comprises, as shown diagrammatically in FIG. 6 described below, two ring mixers 40 and 41 including very fast diodes, Schottky diodes, which are connected in cascade and controlled in parallel via a selector diode 35 by the output voltage from the AGC in accordance with the invention.

The signal output from the IF attenuator 34 passes successively through a highpass filter 37 for avoiding the latching which would otherwise tend to appear at frequencies of a few megahertz because of the extremely short response time of AGC in accordance with the invention. The signal then passes through a conventional amplifier 38 for compensating the nominal loss of the attenuator 34, and finally it passes through a 3 dB hybrid coupler 39 having a first outlet 310 which constitutes the controlled IF output from the circuit in accordance with the invention.

The second output 311 from the coupler 39 constitutes the start of the AGC loop in accordance with the invention and is connected, as shown, to an isolating amplifier 11.

The output from the amplifier 11 is connected to a first feedback loop 312 which comprises in succession: an amplitude detector 12 having a very short response time, of about 1 nanosecond, e.g. a Schottky diode detector; then a differential amplifier 13, likewise having a very short response time and having its other input connected to a conventional AGC reference voltage $V_1$; and then a highspeed sampler 14 which may be constituted, for example, by a conventional CMOS analog gate having a response time of few tens of nanoseconds and controlled at 15 by the voltage v delivered by the second feedback loop, described below.

A capacitor 16, having a value of 0.022 μF for example, is connected between the output from the sampler 14 and ground. It serves as a low pass filter in the AGC control loop and also serves to store the output voltage V from said sampler 14. The voltage V is also applied to the positive input of an operational amplifier 17 having gain G and thus supplying an output voltage of amplitude GV. In conventional manner, a negative feedback resistance $R_1$ is connected between the output amplifier 17 and its negative input terminal, and a gain-defining resistance $R_2$ is connected between the negative input terminal and ground, with the values of the resistance $R_1$ and $R_2$ being conventionally a few kilohms.

The output 36 from the operational amplifier 17 is applied, as mentioned above, as the control voltage to the highspeed attenuator 34, via a selection diode 35.

The output from the isolating amplifier 11 is also applied to a second feedback loop 313 for controlling the sampler 14 located in the first feedback loop 312.

The second loop 313 comprises first and second paths 314 and 315 connected in parallel. The first path 314 connects the output from the isolating amplifier 11 to a first input terminal of an OR gate 25 whose output is connected to the control terminal 15 of the sampler 14, and the second path 315 connects the same output from the isolating amplifier 11 to a second input terminal to said OR gate 25.

The first path 314 in the loop 313 comprises, in succession: a bandpass filter 18 having a very narrow band, e.g. having a bandwidth of 1 MHz at 3 dB, centered on the carrier frequency which is 140 MHz in the present example, and followed by a highspeed threshold rectifier 19.

The second path 315 of the loop 313 comprises, in succession, a highspeed rectifier 25 identical to the detector 12 for example, then a diode 22 for charging a capacitance 21 which is connected between the output from the diode 22 and ground, and which has a capacitance of about 10 μF, for example. A high resistance 23, e.g. about 1 Megohm is connected in parallel with the capacitor 21 to discharge it very slowly. The voltage appearing across the terminals of the capacitor 21 is applied to the negative input terminal of an analog comparator 24 whose positive input terminal is connected to receive a reference voltage $V_2$. The output from the comparator 24 is connected, as shown, to the lower of two input terminals to the OR gate 25.

Operation of the FIG. 4 circuit is now described with reference to the waveform diagrams of FIGS. 5A to 5D.

The description begins with the startup sequence which is indispensible. A priori in the absence of any input signal at 31 and with the analog gate 14 in the open position, the voltage V appearing across the capacitor 16 is zero, such that the output 36 is grounded and the attenuator 34 is off, i.e. no signal from 31 can pass through and the circuit is incapable of starting. The path 315 of the loop 313 is intended to avoid this situation, and it thus constitutes the startup means for an AGC circuit in accordance with the invention.

When there is no voltage across the capacitor 21, the voltage on the negative input terminal of the comparator 24 is zero, such that the reference voltage $V_2$ is the only voltage applied thereto (via the positive input terminal) causing the output of the comparator 24 to take up its high level by virtue of the input voltages $V_2$ and zero applied to its inputs. A control voltage v thus exists at the output from the OR gate 25 causing the analog gate 14 to be closed, consequently, the AGC reference voltage $V_1$ maintains a voltage $V_d$ on the capacitance 16, and the operational amplifier 17b therefore applies a degree of control voltage $GV_d$ to the attenuator 34 via output 36. This control voltage is called the startup control voltage. The circuit is thus capable of starting, and packets such as the packets shown in FIG. 5A (which corresponds to FIG. 2) may appear on output lines 310 and 311.

In accordance with the invention, a packet such as that shown in FIG. 5A is amplitude regulated by the FIG. 4 circuit in the following manner:

The useful signal of the output from the amplifier 38 is applied via the coupler 39 and the amplifier 11 to the highspeed detector 12 which provides a rectangular signal at its output, as in shown in waveform diagram 5D. This rectangular signal is representative of the envelope of the packet, and thus lasts for the same duration as the packet, with a small delay r introduced by the detector 12. This rectangular signal is applied in conventional manner for an AGC to the AGC differential amplifier 13 which thus provides an output AGC control voltage which, in a conventional circuit that does not include a sampler 14, would be directly applied to the attenuator 34 throughout the duration of the packet. In accordance with the invention, the differential output voltage from the amplifier 13 is directly applied only for the duration of the first portion 7 of the packet preamble 6, which portion corresponds to the transmission of pure carrier wave (ignoring an absolute delay τ).

To this end, the useful signal at the output from the amplifier 11 is passed through the narrow band filter 18 which is centered on the carrier frequency such that its output voltage has a waveform as shown in FIG. 5B throughout the duration of said first portion 7 of the preamble 6, and has a substantially zero value during the remainder of the packet. The detector 19 transforms this signal into a rectangular pulse as shown in FIG. 5C, whose duration is slightly less than the duration of said first carrier frequency portion 7 and which is slightly late relative thereto (by an amount τ) due to the transit time through the narrow band filter 18.

Further, it is clearly necessary while the AGC in accordance with the invention is operating and so long as the voltage is stored on the capacitance 16, to inhibit the startup channel 315, i.e. to force the output from the comparator 24 to low level. In order to do this, the useful signal at the output from the amplifier 11 is also detected by the detector 20 which converts it into a rectangular signal of the kind shown in FIG. 5D and which is applied throughout the duration of the packet envelope to charging the capacitance 21 via its charging diode 22 so that it has a voltage greater than $V_2$ (with said voltage $V_2$ being chosen to ensure that this is the case) so that the output from the comparator 24 remains at its low level throughout the duration of the pulse shown in FIG. 5D and also between packets provided they are frequent enough to keep the capacitor 21 charged to a threshold value greater than the threshold V₂.

The short pulse from the rectifier 19 and shown in FIG. 5C is thus applied on its own after passing through the OR gate 25 to the control terminal 15 of the sampler 14. Throughout the short duration of this pulse the analog gate constituting said sampler is closed. As shown above, the AGC voltage is normally present during this period of time at the output of the differential amplifier 13, thereby causing the circuit to act as a conventional, albeit very fast acting, AGC and it regulates the signal by means of the attenuator 34. This continues throughout the duration of the FIG. 5C pulse, i.e. throughout the duration of the first portion 7 of the preamble 6 (ignoring the delay $\tau$).

Throughout this period, the capacitor 16 is charged to the peak voltage V at the output from the differential amplifier 13.

When the rectangular pulse at the output from the detector 19 disappears (as shown in FIG. 5C), no further signal is applied to either of the inputs of the OR gate 25 so the control voltage v at 15 becomes zero and the analog gate 14 opens at once, thereby preventing the normal AGC control voltage at the output from the differential amplifier 13 from being applied any longer.

However, since the control switch 14 is open, the capacitor 16 only sees the very high input impedance of the positive input terminal of the operational amplifier 17 connected thereacross. The capacitance 16 therefore remains charged to the AGC voltage V to which it was charged prior to the switch 14 being opened. This state of affairs continues until the next pulse of the type shown in FIG. 5C, or else if such a pulse does not arrive, until the next startup phase. The voltage V becomes a voltage GV at the output from the differential amplifier 17 and continues to be applied without modification via the diode 35 to control the attenuator 34 throughout the time required for the remainder of the packet to pass, and indeed this control voltage continues to be applied for the period between the current packet and the next thus maintaining gain conditions unaltered relative to the conditions set up during the FIG. 5C pulse. In other words, gain conditions are established while the first portion 7 of the preamble is being received (ignoring the delay $\tau$).

If no packet is received for a very long period of time at the packet time scale (i.e. for a period of several seconds) then the signal shown in FIG. 5D no longer regularly charges the capacitor 21 and in due course this capacitor discharges through the resistance 23, causing the output signal from the comparator 24 to return to its high level so that a continuous closure signal is again applied to the control input 15 of the analog gate 14, thereby closing the analog gate. The rectangular pulse of the output from the detector 12 is exactly identical to and synchronous with the pulse which appears at the output from the detector 20, and since both of these pulses have thus disappeared, the AGC reference voltage V₁ is again applied until the next packet arrives via the gate 14, the amplifier 17, and the diode 35 to the control input of the attenuator 34. The discharge time constant of the capacitance 21 via the resistance 23 should be chosen to be long relative to a frame which should, by definition, include at least one packet.

Reference is made to FIG. 6 which shows, by way of example, the circuit diagram of a highspeed control attenuator 34 as used in the FIG. 4 circuit. As can be seen in the drawing, this attenuator (which is novel in this type of utilization) is constituted by two ring mixers 40 and 41 having Schottky diodes (such mixers being known per se) with the mixers being connected in series and controlled in parallel by the inlet 36 via a selection diode 35. The output signal from the amplifier 33 in FIG. 4 is applied at 43 to the input of the first ring mixer 40, which normally serves in conventional ring mixer modulators for receiving the local oscillator wave, and the output signal is taken at 44 from the second ring mixer 41 after being attenuated by the voltage applied to both mixers at 36. This output signal is applied to the high pass filter 37 shown in FIG. 4. The use of one or more ring mixers (such as are conventionally used as amplitude modulators) in a highspeed controlled attenuator is novel at this time, so far as the Applicant is aware. The response time of such a ring mixer is about 1 nanosecond, and it is thus considerably faster than that of controlled attenuators using PIN diodes such as are commonly used in conventional AGC circuits, which attenuators generally have a response time of about 1 microsecond.

In a circuit in accordance with the invention a single ring mixer such as 40 could be used. However, it is preferred to use two ring mixers 40, 41, or even more than two, connected in series and controlled in parallel in order to be able to provide attenuation over a sufficiently wide range.

The invention is naturally not limited to the embodiment described above, which is specifically adapted to TDMA transmissions of the type used in the INTELSAT and EUTELSAT networks, and in which the beginning of the preamble 6 in each packet (see FIG. 2) is constituted by a pure wave 7 at the carrier frequency. The invention is applicable to any system, such as that outlined in FIG. 8, in which the beginning of the preamble 6 can be used to recover a pure carrier (even if it performs other functions as well).

Figure 8:
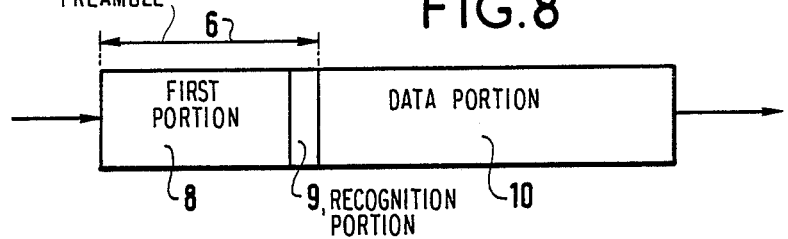
FIG. 8 is a diagram of a data packet for use in a network other than the INTELSAT or EUTELSAT networks, in which the first portion of the preamble is constituted by a $\pi$ phase shift wave.

FIG. 8 is a diagram of a packet in some other TDMA transmission system in which the preamble 6 of each packet is composed solely of a first portion 8 made up of $\pi$ phase shifts, followed by a unique or recognition word 9.

"$\pi$ phase shifts" can be used, as explained below, to recover a pure carrier as well as being used to recover the clock.

Figure 7A:
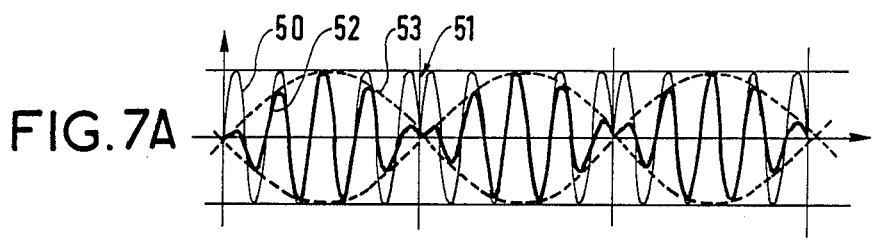
FIGS. 7A and 7B are waveform diagrams showing the constitution of the "$\pi$ phase shift" wave used in a TDMA setup employing the invention.
Figure 7B:
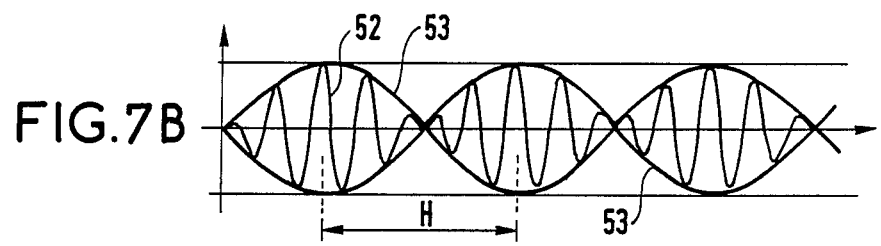

The waveform diagrams of FIGS. 7A and 7B are used to explain this phenomenon, and to recall how the "$\pi$ phase shift" portion 8 is constituted.

Reference is made initially to FIG. 7A. To begin with, the $\pi$ phase shift wave is made by forcing $\pi$ radian phase shifts at the symbol rate on a pure carrier wave 50 (as at 51). In reality, since the spectrum is necessarily truncated by passband filtering, the voltage obtained has the curved shape of the curve 52, i.e. it ends up with the shape shown in FIG. 7B which is a carrier frequency wave 52 fully modulated by another sinewave 53 whose period is twice the cock period H, i.e. its frequency is equal to one-half of the clock frequency $f_H$. In the frequency spectrum, the spectrum of the $\pi$ phase shift signal shown in FIG. 7B is thus solely constituted by two spectrum lines situated on either side of the carrier frequency and at distances corresponding to ±one-half of the clock frequency therefrom. Automatic gain control can thus be provided with this type of packet in accordance with the invention by filtering one or other or both of said spectrum lines instead of filtering the pure frequency as was done in the FIG. 4 circuit. Only the second loop 313 of the FIG. 4 circuit needs to be slightly modified and this is described in greater detail below with reference to FIG. 9.

Figure 9:
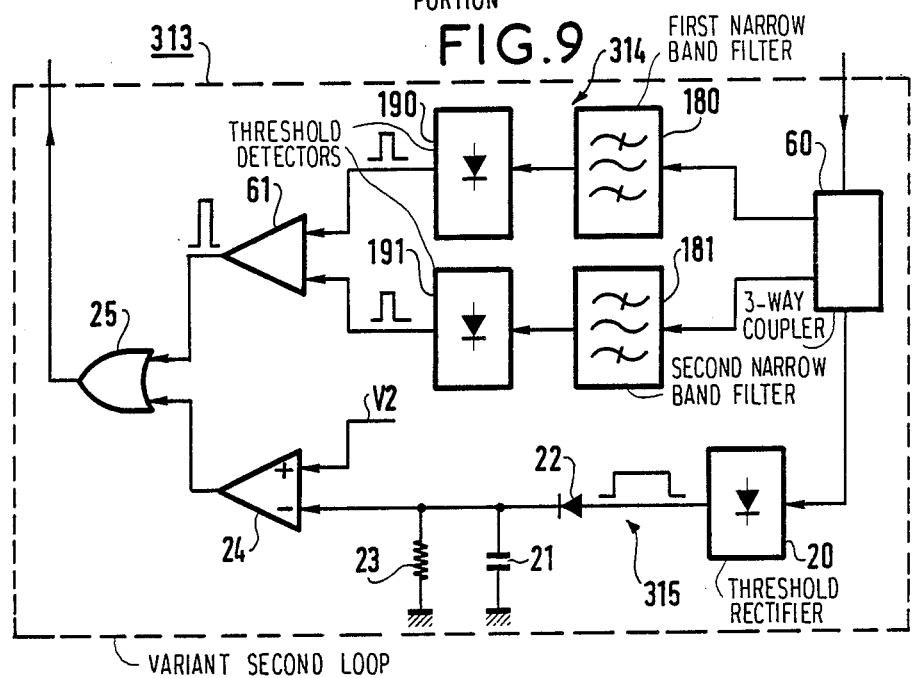
FIG. 9 is a block diagram of a variant of the FIG. 4 circuit suitable for use, in accordance with the invention, with data packets of the type shown in FIG. 8.

FIG. 9 shows a variant second loop 313 for inclusion in a circuit such as that shown in FIG. 4. An additional threeway coupler 60 is provided to provide coupling to three paths, the bottom path 315 which leads to the lower input to the OR gate 25 remains otherwise unchanged from that described above.

However, the upper path 314 is different. It comprises a first narrow band filter 180 having the same filter characteristics as the filter 18 of FIG. 4, but having a center frequency adjusted to match the lower frequency line $(f-(f_H/2))$, where f is the carrier frequency at 140 MHz, for example, and a second narrow band filter 180 of the same type but having its center frequency adjusted to the upper frequency line $(f+(f_H/2))$, with each of these two filters receiving an input signal from the output of the coupler 60. The narrow band filters 180 and 181 are followed by respective threshold detectors 190 and 191 which are identical to the detector 19 of FIG. 4, and the resulting narrow output pulses, which are synchronous, are applied to respective inputs of a 2-input analog adder 61 whose output is applied to the upper input terminal to the OR gate 25.

The operation of this circuit is identical to that of the FIG. 4 circuit with the highspeed AGC acting, in this case, essentially during the first portion 8 of the preamble 6 of the packet outline in FIG. 8 (ignoring the above-defined delay $\tau$), and remains stored in memory the remainder of the time, i.e. during the remainder of the packet and between that packet and the following packet, except for startup periods.

We claim:

1. A method of providing automatic gain control (AGC) in a time division multiple access (TDMA) receiver, said receiver receiving data packets in succession from one or more transmitter stations, each packet comprising, in succession, a preamble and then a data sequence, said preamble beginning at least with a first portion for enabling the receiver to recover the frequency of a signal carrier wave, said method comprising the steps of; performing automatic gain control on at least a part of said first portion of said preamble by storing the amplitude of the AGC voltage during the period that said automatic gain control is being peformed, and interrupting said automatic gain control while allowionng said stored AGC voltage to act on the received signal, at least for the remainder of said packet, said automatic gain control having a reaction time which is very much less than the time available for the automatic gain control to act on said part of said first portion of said preamble.

2. A method according to claim 1, using automatic gain control having a reaction time of a few hundred nanoseconds on data packets having a preamble which lasts for several microseconds.

3. An automatic gain control circuit for a time division multiple access (TDMA) receiver, said receiver receiving data packets in successions from one or more transmitter stations, each packet comprising, in succession, a preamble and then a data sequence, said preamble beginning at least with a first portion for enabling the receiver to recover the frequency of a signal carrier wave, and implementing a method of providing automatic gain control by performing automatic gain control on at least a part of said first portion of said preamble, storing the amplitude of the AGC voltage during the period that said automatic gain control is being performed, and interrupting said automatic gain control while allowing said stored AGC voltage to act on the received signal, at least for the remainder of said packet, and wherein said automatic gain control has a reaction time which is very much less than the time available for the automatic gain control to act on said part of said first portion of said preamble, said circuit comprising:

a direct transmission path for the useful signal, said path being equipped with a controlled attenuator having a very short response time relative to the duration of said preamble;

a first feedback loop for controlling the attenuator and comprising in succession a highspeed detector, a comparator receiving a reference AGC voltage, a highspeed controlled sampler, and storage means for storing the output signal from said control sampler; and a second feedback loop for controlling said controlled samples and comprising, in parallel, a first path including a at least one narrow band filter centered on a pure frequency conveyed by said first portion of said preamble, and a second path comprising in succession a highspeed detector and a comparator which additionally receives a reference voltage, both of said paths being connected to respective input terminals to an OR gate whose output is connected to the control input of said highspeed sampler.

4. An AGC circuit according to claim 3, in which said highspeed attenuator and said highspeed detectors have a response time of about 1 nanosecond.

5. An AGC circuit according to claim 3, wherein said highspeed attenuator comprises a ring mixer.

6. An AGC circuit according to claim 3, wherein said highspeed attenuator is constituted by a plurality of ring mixers connected in series and controlled in parallel.

* * * * *